United States Patent
Orlowski (10) Patent No.: US 7,256,077 B2
(45) Date of Patent: Aug. 14, 2007

(54) METHOD FOR REMOVING A SEMICONDUCTOR LAYER

(75) Inventor: Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 10/851,607

(22) Filed: May 21, 2004

(65) Prior Publication Data

US 2005/0260816 A1    Nov. 24, 2005

(51) Int. Cl.
*H01L 21/84* (2006.01)
(52) U.S. Cl. .................. 438/151; 438/412; 438/422; 438/739; 438/753
(58) Field of Classification Search .............. 438/411, 438/412, 421, 422, 151, 739, 753
See application file for complete search history.

(56) References Cited

U.S. PATENT DOCUMENTS

| | | | |
|---|---|---|---|
| 5,277,748 A | 1/1994 | Sakaguchi | |
| 6,200,878 B1 * | 3/2001 | Yamagata et al. | 438/406 |
| 6,593,211 B2 | 7/2003 | Sato | |
| 6,656,271 B2 | 12/2003 | Yonehara | |
| 6,713,356 B1 * | 3/2004 | Skotnicki et al. | 438/285 |
| 6,964,911 B2 * | 11/2005 | Orlowski et al. | 438/400 |
| 2002/0097608 A1 | 7/2002 | Skotnicki | |
| 2002/0135020 A1 * | 9/2002 | Skotnicki et al. | 257/368 |
| 2002/0163027 A1 * | 11/2002 | Skotnicki et al. | 257/302 |
| 2004/0126985 A1 * | 7/2004 | Bendernagel et al. | 438/411 |
| 2004/0235262 A1 * | 11/2004 | Lee et al. | 438/411 |
| 2005/0118783 A1 * | 6/2005 | Oh et al. | 438/421 |

FOREIGN PATENT DOCUMENTS

FR    2 799 307 A1 *    4/2001

OTHER PUBLICATIONS

Jurczak et al., "Silicon-on-Nothing (SON)—An Innovative Process for Advanced CMOS," IEEE Transactions on Electron Devices, vol. 47, No. 11, Nov. 2000, pp. 2179-2187.
Monfray et al, "First 80nm SON (Silicon-on-Nothing) MOSFET's With Perfect Morphology and High Electrical Performance," IEEE, pp. 29.7.1-29.7.4 (2001).
Ghulinyan et al., "Free-Standing Porous Silicon Single and Multiple Optical Cavities," Journal of Applied Physics, vol. 93, No. 12, Jun. 15, 2003, pp. 9724-9729.
Sakaguchi et al., "ELTRAN by Water-Jet Splitting in Stress-Controlled Porous Si," IEEE International SOI Conference, Oct. 1999, pp. 110-111.

(Continued)

*Primary Examiner*—M. Wilczewski
*Assistant Examiner*—Toniae M. Thomas
(74) *Attorney, Agent, or Firm*—Kim-Marie Vo (57) ABSTRACT

A method of forming a semiconductor device includes forming a first layer over a semiconductor substrate and forming a second layer over the first layer. The second layer includes silicon and has an etch selectivity to the second layer that is greater than approximately 1,000. In one embodiment, the second layer is a porous material, such as porous silicon, porous silicon germanium, porous silicon carbide, and porous silicon carbon alloy. A gate insulator is formed over the second layer and a control electrode is formed over the gate insulator. The first layer is selectively removed with respect to the second layer and the semiconductor substrate.

19 Claims, 4 Drawing Sheets

OTHER PUBLICATIONS

Ito et al., "Scalability Potential in ELTRAN SOI-Epi Wafer," IEEE International SOI Conference, Oct. 2000, pp. 10-11.

Related U.S. Appl. No. 10/795,847, filed Mar. 8, 2004.
Related U.S. Appl. No. 10/668,714, filed Sep. 23, 2003.

* cited by examiner

METHOD FOR REMOVING A SEMICONDUCTOR LAYER

FIELD OF THE INVENTION

This invention relates generally to a method for forming semiconductor devices, and more specifically, to a method for removing a semiconductor layer as part of the process of forming a semiconductor device.

BACKGROUND

Semiconductor-on-insulator (SOI) devices generally have superior properties over bulk devices. SOI devices are typically formed with SOI wafers, which include a layer of semiconductor material, a layer of oxide overlying the semiconductor material, and another layer of semiconductor material overlying the oxide layer. The semiconductor material can be a variety of different types of semiconductor materials such as, for example, silicon, silicon germanium, etc. However, SOI wafers are more expensive than bulk semiconductor wafers. Furthermore, it is expensive and time consuming to transfer existing circuit designs from bulk substrates to SOI substrates. Therefore, a need exists for a method which provides a cost effective method for providing higher quality SOI devices while allowing for the use of existing circuit designs fashioned for bulk substrates, when desired.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described above, SOI wafers are typically more expensive than bulk wafers; however, SOI devices generally have superior properties as compared to bulk devices. Furthermore, many existing designs use bulk devices and the conversion of these existing devices to SOI designs such that they can be formed on an SOI wafer becomes expensive in terms of processing and design costs. Therefore, one embodiment of the present invention described herein allows for the formation of local SOI regions on a bulk semiconductor substrate. The insulator here is air and thus, the technology may also be referred to as silicon-on-nothing (SON) devices. In this manner, local SON regions may be formed on a bulk wafer where needed for improved device properties while still allowing for bulk designs to be integrated on a same wafer. Any number of local SON regions may be formed on a wafer and these SON regions may be of any size. As described herein, in one embodiment, the SON process allows for improved processing because (non-porous or dense) silicon germanium is not used as the sacrificial layer for the SON regions and instead a porous material such as porous silicon, porous silicon germanium, porous silicon carbon alloy $(Si_{(1-x)}C_x)$ or porous silicon carbide (SiC) is used because it has good etch selectivity to surrounding silicon-containing layers.

Figure 1:
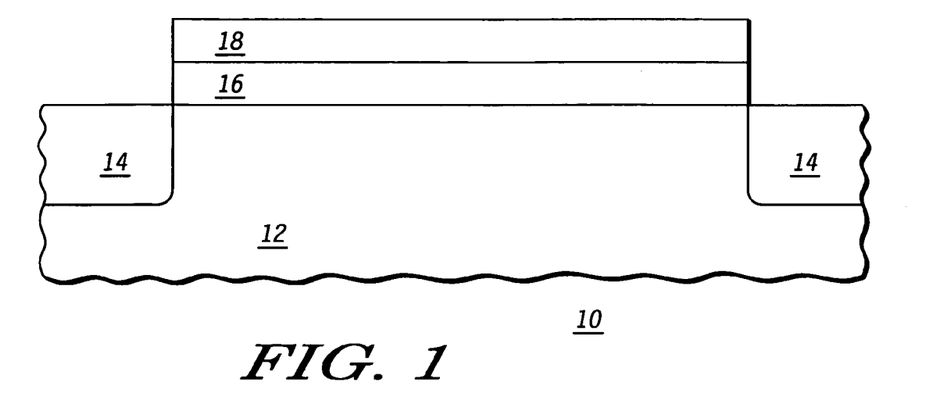
FIG. 1 illustrates in cross-section a portion of a semiconductor device having semiconductor layers formed over a semiconductor substrate in accordance with one embodiment of the present invention.

Illustrated in FIG. 1 is a cross-section of a semiconductor device 10 with isolation regions 14 formed within the semiconductor device 10 and a first semiconductor layer 16 and a second semiconductor layer 18 formed over the semiconductor substrate 12. In a preferred embodiment, the semiconductor substrate 12 is monocrystalline silicon, but the semiconductor substrate 12 may be silicon germanium, gallium arsenide, silicon carbide, silicon carbine alloy, the like, and combinations or the above. The isolation regions 14 may be shallow trench isolation (STI) regions formed using conventional methods. In the embodiments shown in FIG. 1, the isolation regions 14 are coplanar with the top surface of the semiconductor substrate 12. In another embodiment, the isolation regions 14 are higher than the top surface of the semiconductor substrate 12.

After providing a semiconductor substrate 12 and forming the isolation regions 14, the first semiconductor layer 16 is formed, in one embodiment, by epitaxially growing a porous semiconductor layer that includes silicon, such as silicon germanium (SiGe), silcon carbon alloy, or silicon carbide. In one embodiment, the first semiconductor layer is porous silicon having a porosity between approximately twenty (20) and approximately fifty (50) percent.

Generally, the first semiconductor layer 16 is formed over the exposed portions of the semiconductor substrate 12. Therefore, in the illustrated embodiment, the first semiconductor layer 16 would also be formed on either side (not shown) of isolation regions 14. In one embodiment, where isolation regions (such as isolation regions 14) are not yet formed, the first semiconductor layer would be formed over all of the semiconductor substrate 12. In one embodiment, the first semiconductor layer 16 has a thickness in a range of approximately 5 to approximately 200 nanometers. More preferably, the thickness may be in a range of approximately 50 to approximately 200 nanometers.

To form porous silicon the semiconductor device 10 can be anodized in an HF solution. For example, to form a porous silicon layer that is approximately 200 nanometers in thickness, a current density of 30 mA per $cm^2$, an anodizing solution of HF: $H_2O$:$C_2H_5OH$ in a ratio of 1:1:1 for approximately ten seconds can be used. The resulting porous silicon should have a porosity of approximately 45 percent. However, if it is desirable to increase the time of processing on the order of minutes, a lower current density (e.g., less than 5 mA per $cm_2$) may be desirable. In addition, decreasing the current density may decrease the porosity. In addition, other processes can be used to form the porous silicon.

Furthermore, any material that has an etch selectivity to the subsequently formed second semiconductor layer 18 and the semiconductor substrate 12 that is greater than approximately 1,000, or more preferably greater than approximately 10,000 can be used for the first semiconductor layer 16. In one embodiment, the selectivity is between 1,000 and 100,000 or more preferably between 10,000 to 100,000. Porous silicon has an etch selectivity of approximately 100,000 to (nonporous or dense) silicon, which can be used for the second semiconductor layer 18 and the semiconductor substrate 12. Hence, the selectivity may be equal to approximately 100,000. The importance of the etch selectivity will be better appreciated once the removal of the first semiconductor layer 16 is discussed in regards to FIG. 3. After forming the first semiconductor layer 16, the semiconductor layer 16 may be sealed by exposing the first semiconductor layer 16 to silane or disilane, which occurs when forming the second semiconductor layer 18.

The second semiconductor layer 18 is formed over the first semiconductor layer 16. In one embodiment, the second semiconductor layer 18 is monocrystalline silicon (Si) epitaxially grown from the first semiconductor layer 16. The epitaxial growth can occur as a blanket process or a selective process. To grow the second semiconductor layer 18 in a blanket epitaxially process silane ($SiH_4$) or disilane ($Si_2H_6$) may be used. In this embodiment, the second semiconductor layer 18 will be formed over the first semiconductor layer 16 and the isolation regions 14. A subsequent etch process is performed to remove the portions of the second semiconductor layer 18 that were formed over the isolation regions 14. However, the etch process is not performed if instead, a selective epitaxial growth process occurs because with selective epitaxial growth the second semiconductor layer 18 is formed only over the first semiconductor layer 16. To selectively grow monocrystalline silicon over porous silicon a chemical vapor deposition process, or other suitable process can be used using $SiH_2Cl_2/H_2$ with the gas flow rate set at approximately 0.5/180 l/min (3L/S), a gas pressure of approximately 80 Torr ($1.07 \times 10^4$ Pa), and a temperature of approximately 950 degrees Celsius. In addition, other processes can be used to form the second semiconductor layer, such as atomic layer deposition (ALD), chemical vapor deposition (CVD), plasma enhanced CVD (PECVD), metal organic CVD (MOCVD), physical vapor deposition (PVD), the like or combinations of the above.

In one embodiment, the second semiconductor layer 18 has a thickness in a range of approximately 20 to approximately 200 nanometers, or more preferably, a range of approximately 50 to approximately 120 nanometers. As will become apparent below, the second semiconductor layer 18 will serve as a channel region for the semiconductor device and, thus it is desirable that the second semiconductor layer 18 has a crystalline structure to achieve the desired electrical properties in the channel region. Therefore, in one embodiment, this thickness may be selected based on the desired thickness of the resulting device channel and the amount of the second semiconductor layer 18 that will be consumed during subsequent oxidation. However, if a metal oxide, such as $HfO_2$ or $ZrO_2$, is deposited as the gate dielectric the thickness of layer 18 will substantially remain unchanged because this type of material is not substantially consumed during subsequent oxidation. The second semiconductor layer 18 can be any semiconductor material that can be able to be etched selective to the first semiconductor layer 16 and is preferably crystalline. In one embodiment, the first semiconductor layer 16 is approximately 20 to approximately 500 nanometers in length.

Figure 2:
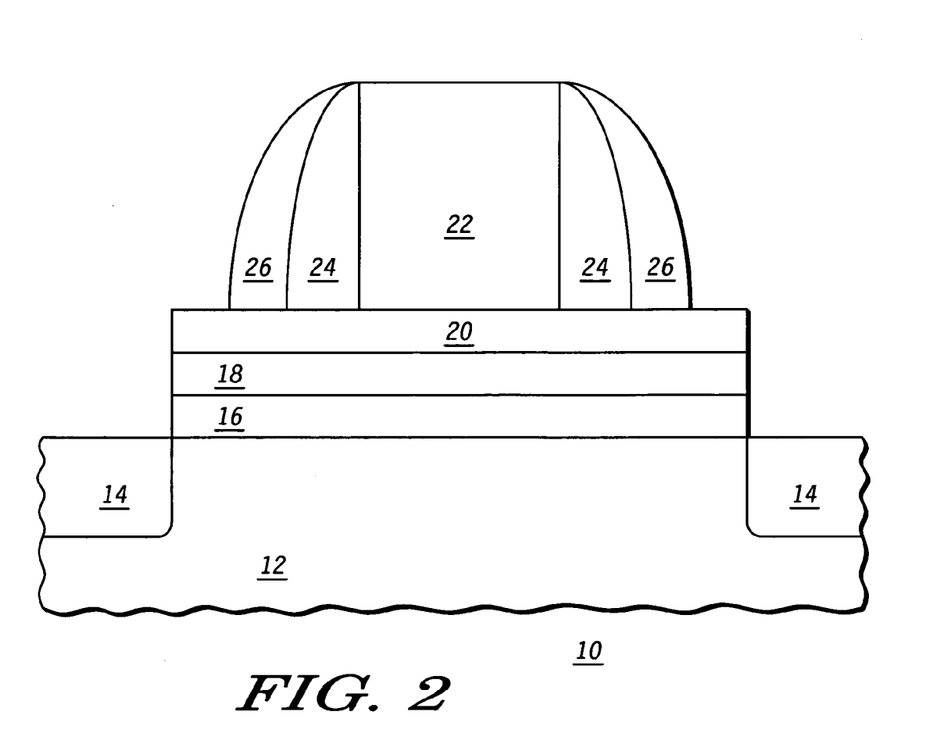
FIG. 2 illustrates the semiconductor device of FIG. 1 after forming a dielectric layer, a gate electrode and spacers in accordance with one embodiment of the present invention.

After forming the first semiconductor layer 16 and the second semiconductor layer 18, a first dielectric layer 20 is formed over the second semiconductor layer 18, as shown in FIG. 2. A portion of the first dielectric layer 20 will serve as the gate dielectric for the semiconductor device, as will be better understood after further processing is explained. The first dielectric layer 20 may include any material or materials suitable for gate dielectrics, such as, for example, silicon oxide, silicon oxynitride, nitrided oxide, hafnium oxide, zirconium oxide, metal silicate, metal oxy-nitride, metal-silicon-oxynitride, other metal oxides, any high dielectric constant (K) material, or any combination thereof. The first dielectric layer 20 may be formed using conventional deposition or growth techniques such as ALD, CVD, PECVD, MOCVD, PVD, the like or combinations of the above.

A conductive layer is formed over the first dielectric layer 20 and patterned to form a gate electrode 22 (control electrode 22), as shown in FIG. 2. The gate electrode 22 may be a polysilicon gate or a metal gate. Any suitable materials may be used. Note that conventional processes may be used in the formation of the gate electrode 22. Also note that any type of device may be formed. In one embodiment, the gate electrode 22 may be a polysilicon gate, a metal gate, a silicide gate, the like, or any suitable combination thereof. For example, if the gate electrode 22 is a metal gate, the gate electrode 22 may include titanium nitride, tantalum silicon nitride, suitable metal carbide (such as TaC), boride, or their nitrides, or any combination thereof. The gate electrode 22 may be a stack having multiple layers.

After forming the gate electrode 22, a nitride layer, which is a dielectric layer, is deposited over the semiconductor device 10 and anisotropically etched using known processes to form nitride spacers 24, which serve to laterally isolate the gate electrode 22 from other layers. In one embodiment, an optional oxide (not shown) may be present between the nitride spacers 24 and the gate electrode 22. The oxide liner can be any oxide and can be formed using any process such as ALD, CVD, PVD, grown, or combinations of the above.

Formed over the nitride spacers 24 is a second dielectric layer, which in one embodiment is silicon dioxide formed using tetraethyorthosilane (TEOS). Alternatively, any dielectric material may be used. The second dielectric layer is anisotropically etched using known processes to from dielectric spacers 26, which are optional. The patterned gate electrode 22, the nitride spacers 24, and the dielectric spacers 26 are illustrated in FIG. 2. One should note that any number of spacers can be used and that the formation of spacers is not limited to that taught herein.

Figure 3:
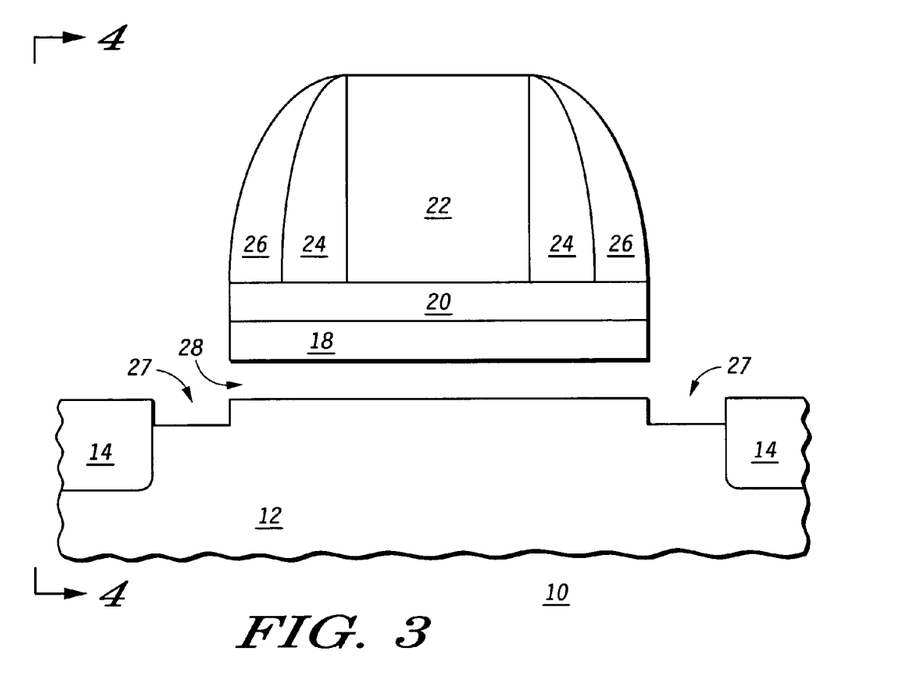
FIG. 3 illustrates the semiconductor device of FIG. 2 after removing a semiconductor layer in accordance with one embodiment of the present invention.

As shown in FIG. 3, after forming the spacers 24 and 26, the first dielectric layer 20, portions of the second semiconductor layer 18 and the first semiconductor layer 16 are etched anisotropically in regions laterally adjacent of gate electrode 22, which will accommodate source and drain electrodes later in the integration process, using the dielectric spacers 26 as a hardmask. The first semiconductor layer 16 is then removed. (If the dielectric spacers 26 where not present, the nitride spacers 24 could be used as a hardmask.) In one embodiment, a plasma etch is performed to etch the first dielectric layer 20, the second semiconductor layer 18, and the first semiconductor layer 16. The first dielectric layer 20 and the second semiconductor layer 18 can be etched using conventional chemistries and the second semiconductor layer 16 can be etched using a mixture of HF, $H_2O_2$, and $H_2O$, in one embodiment. It should be noted that when etching the first semiconductor layer 16, sides of the first semiconductor layer 16 (as well as the first dielectric layer 20 and the second semiconductor layer 18) are exposed. The plasma etch may etch into the semiconductor substrate 12 and form recesses 27 in the semiconductor substrate 12. The recesses 27 may be formed because the etch chemistries used to pattern the second semiconductor layer 18 and the first semiconductor layer 16 may not be sufficiently selective to the material used for the semiconductor substrate 12.

After etching the first dielectric layer 20, the second semiconductor layer 18, and the first semiconductor layer 16, portions of the first semiconductor layer 16 are removed using a wet or plasma etch to form a gap or void 28. In one embodiment, element 28 is a tunnel. In one embodiment, the first semiconductor layer 16 is laterally etched. In one embodiment, the chemistry used attacks the exposed sides of the first semiconductor layer 16, thereby removing the first semiconductor layer 16. In one embodiment, a mixture of HF, $H_2O_2$, and $H_2O$ is used. The chemistry used should be selective to the second semiconductor layer 18 and the semiconductor substrate 12. In addition, the chemistry should be selective to the first dielectric layer 20 and the dielectric spacers 26. For example, dilute HF, nitric acid and water may be used to etch the first semiconductor layer 16 if the first semiconductor layer 16 is porous silicon, the second semiconductor layer 18 and the semiconductor substrate 12 are silicon and the first dielectric layer 20 and the dielectric spacers 26 are silicon dioxide. In the embodiment shown in FIG. 3, substantially all of the first semiconductor layer 16 is removed.

If the gate length is greater than or equal to approximately 2.0 microns, a portion of the first semiconductor layer 16 (remaining portion of the first semiconductor layer 16), however, may remain underneath the gate electrode 22. Due to the higher selectivity of porous Si than that of SiGe to Si, substantially all of the porous Si can be more easily removed and hence longer transistors can be formed. The remaining portion of the first semiconductor layer 16 will be approximately in the center of the gap 28 because the chemistry is unable to remove all of the first semiconductor layer 16. In other words, if the gate length is long enough, the gap 28 may be divided by a portion of the first semiconductor layer 16 that is not removed. However, in the embodiment illustrated in FIG. 3, the entire first semiconductor layer 16 is removed.

Figure 4:
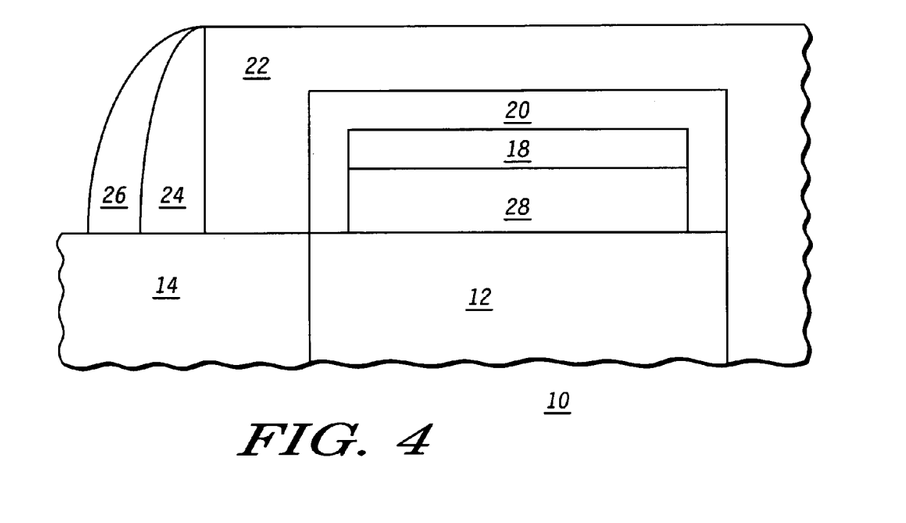
FIG. 4 illustrates another portion and view of the cross-sectional portion of the semiconductor device of FIG. 3 in accordance with one embodiment of the present invention.

When the first semiconductor layer 16 is removed to form the gap 28, the layers above the gap 28 are supported by the gate electrode 22 and the nitride spacers 24 and the dielectric spacers 26 in portions of the semiconductor device 10, which are not shown in FIG. 3 but are illustrated in FIG. 4. FIG. 4 is a cross-sectional view of FIG. 3 in the direction that is perpendicular to the page (i.e., in and out of the page). Thus, the structures in FIGS. 3 and 4 are perpendicular to each other.

As illustrated in FIG. 4, the first dielectric layer 20 wraps around the second semiconductor layer 18 and had wrapped around the first semiconductor layer 16. In other words, the first dielectric layer 20 isolates the second semiconductor layer 18 from the gate electrode 22. When the first semiconductor layer 16 is removed, the first dielectric layer 20 may wrap around the gap 28. Alternatively, the first dielectric layer 20 that wrapped around the first semiconductor layer 16 may be removed when forming the gap 28. The gate electrode 22 extends over the first dielectric layer 20 to the isolation regions 14. In addition, the nitride spacers 24 and the dielectric spacers 26, as shown in FIG. 4, may also terminate on the isolation regions 14. In the embodiment where the isolation regions 14 are higher than the top surface of the semiconductor substrate 12, the first dielectric layer 20 does not wrap downward along the sides of the second semiconductor layer 18 and the gap 28. Instead, the top surface of the second semiconductor layer 18 is coplanar with the top surface of the isolation regions 14, in this embodiment. This is a desirable embodiment since the corners of the second semiconductor layer 18 would not cause problems with process control and device performance in this embodiment.

Figure 5:
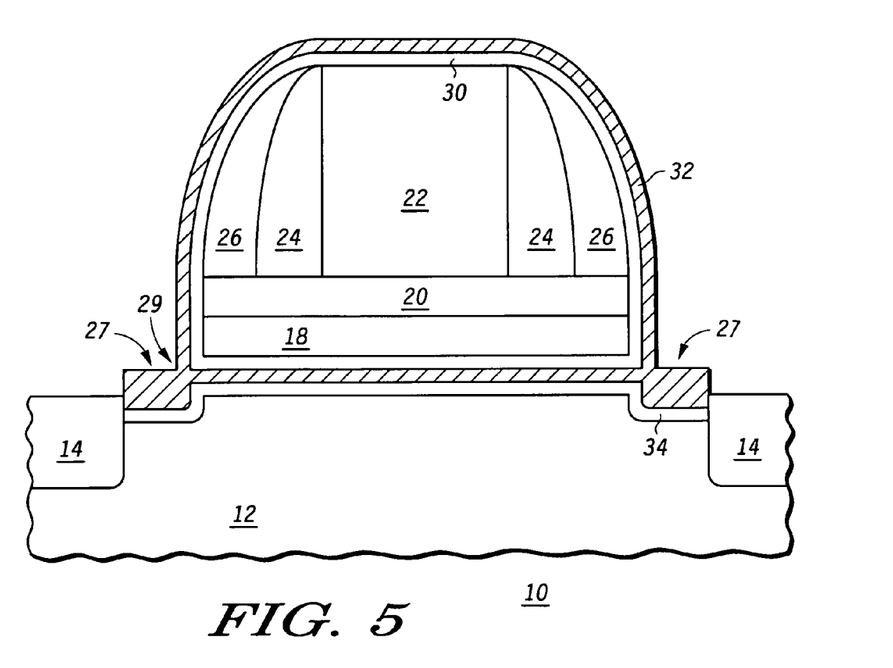
FIG. 5 illustrates the semiconductor device of FIG. 3 after forming insulating layers in accordance with one embodiment of the present invention.

FIG. 5 illustrates the semiconductor device 10 of FIG. 3 after filling the gap 28 to form a tunnel subjacent layer 29. After removing at least a portion of the first semiconductor layer 16, a second dielectric layer 30 and a third dielectric layer 34 are formed at least within the gap 28. The second dielectric layer 30 and the third dielectric layer 34 may be formed by rapid thermal oxidation (RTO) to create a high quality interface between the bottom surface of the second semiconductor layer 18 and the second dielectric layer 30 and the top of the semiconductor substrate 12 and the third dielectric layer 30. A high temperature oxide (HTO) may be deposited after the RTO in order to thicken the second dielectric layer 30 and the third dielectric layer 30 to the desired thickness. In one embodiment, the second dielectric layer 30 and the third dielectric layer have thicknesses of approximately 1 to approximately 20 nanometers, or more specifically approximately 5 nanometers, inside the gap 28. Since the semiconductor device 10 is not masked during the processes to form the second dielectric layer 30 and the third dielectric layer 34, any exposed surfaces will be oxidized. Thus, as shown in FIG. 5, the second dielectric layer 30 is in contact with a portion of the gate electrode 22, a portion of the dielectric spacers 26, a portion of the first dielectric layer 20 and a portion of the second semiconductor layer 18. In addition, the third dielectric layer 34 is in contact with the semiconductor substrate 12 including the recesses 27.

After forming the second dielectric layer 30 and the third dielectric layer 34, nitride layer 32 is chemically vapor deposited (CVD) or plasma vapor deposited (PVD). A nitride (e.g., $Si_3N_4$) is desirable because it prevents oxidation of the second semiconductor layer 18. Furthermore, the nitride should be selective to the first dielectric layer 20, the second dielectric layer 30, and the third dielectric layer 34 so that when the nitride is removed these layers are not affected. Thus, any other material besides a nitride that has these properties can be used. The nitride layer 32 is formed between the second dielectric layer 30 and the third dielectric layer 34 as well as over the portions of the second dielectric layer 30 that are outside the gap 28. The nitride layer 32, the second dielectric layer 30 and the third dielectric layer 34 form an isolation region (i.e., channel isolation structure or layer) for and under the second semiconductor layer 18 (i.e., channel structure 18). In one embodiment, the thickness of the nitride layer 32 in the gap 28 is approximately 5 to approximately 75 nanometers, or more specifically, approximately 25 nanometers.

Figure 6:
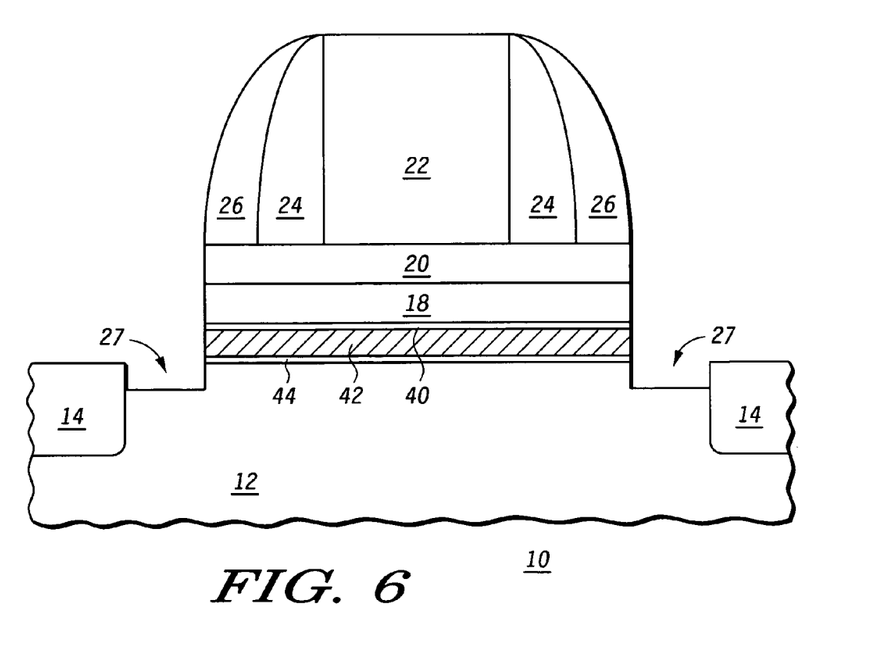
FIG. 6 illustrates the semiconductor device of FIG. 5 after removing portions of the insulating layers in accordance with one embodiment of the present invention.

As shown in FIG. 6, the second dielectric layer 30, the nitride layer 32, and the third dielectric layer 34 are etched to remove portions of these layers that are not under the second semiconductor layer 18 and to form the patterned second dielectric 40, the patterned nitride layer 42, and the patterned third dielectric layer 44. In other words, the portions of the second dielectric layer 30, the nitride layer 32, and the third dielectric layer 34 that do not fill the gap 28 are removed. This includes portions of the third dielectric layer 34 and the nitride layer 32 that are in the recesses 27 and portions of the second dielectric layer 30, the nitride layer 32, and the third dielectric layer 34 that are over the gate electrode 22 and the spacers 24 and 26. A fluorine-based chemistry, such as $CF_4$, may be used. From this etching, portions of the recesses 27 may incidentally be etched further into the semiconductor substrate 12, although not shown.

Figure 7:
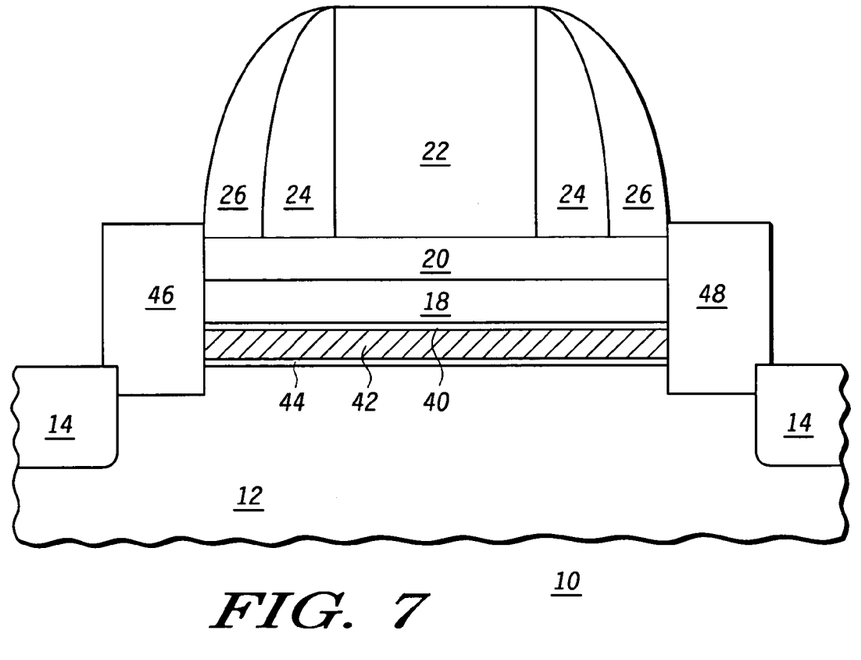
FIG. 7 illustrates the semiconductor device of FIG. 6 after forming current electrodes in accordance with one embodiment of the present invention.

After removing portions of the second dielectric layer 30, the nitride layer 32, and the third dielectric layer 34, an epitaxial semiconductor layer including silicon can be formed in the recesses 27 having a height at least as high as the top surface of the first dielectric layer 20. The epitaxial semiconductor layer can be grown from both the semiconductor substrate 12 and the second semiconductor layer 18. The epitaxial semiconductor layer is doped to form the current electrodes (e.g., source/drain regions) 46 and 48 of the semiconductor device 10, as shown in FIG. 7. The epitaxial semiconductor layer can be doped by growing an in situ doped semiconductor layer or can be grown undoped and ion implantation can be performed to dope the regions as known to a skilled artisan. Due to the epitaxial process, portions of the current electrodes 46 and 48 may be over the isolation regions 14 and under the adjacent the spacers 26, if present, to form elevated current electrodes. The current electrodes 46 and 48 may also be over the top surface of the second semiconductor layer 18 when forming elevated current electrodes.

Alternative processes can be performed other than those discussed above. For example, the first dielectric layer 20 can patterned using the gate electrode 22 as a hardmask thereby exposing portions of the second semiconductor layer 18. The exposed portions of the second semiconductor layer 18 may be doped to form the extensions of the source/drain regions. In this embodiment, the current electrodes 46 and 48 are the deep source/drain regions.

In addition, although the first semiconductor layer 16 has been described to be used in forming a semiconductor device 10 that is a silicon-on-nothing (SON) device, the first semiconductor layer 16 can be used to form a gate-all-around transistor. In gate-all-around technology, a dielectric layer (top dielectric layer) would overly the second semiconductor layer 18 in FIG. 1. The dielectric layer would overlie the first semiconductor layer 16 and the second semiconductor layer 18 and the isolation regions 14. The side of the first semiconductor layer 16 that is being viewed in the cross-sectional illustration in FIG. 1 (as well as the opposite (back) side) is exposed. An etch would attack the sides of the first semiconductor layer 16 and remove the first semiconductor layer 16. A lateral etch that is selective to the dielectric layer, the second semiconductor layer 18 and the semiconductor substrate 12 would be used to remove the first semiconductor layer 16 and form a gap. Next the top dielectric layer is removed, in one embodiment using an HF etch, and another top dielectric layer would be formed encapsulating the bridge to serve as a gate dielectric (or at least a portion of it will serve such function.) The another top dielectric can be formed by oxidation of the second semiconductor layer 18. Subsequent processing would occur so that a gate electrode would be formed over (a portion of) the dielectric layer and under the second semiconductor layer 18 (i.e., within the gap formed by removing the first semiconductor layer 16). Note that the gate electrode would be running in a direction that is perpendicular to the paper and the illustration in FIG. 1.

By now it should be appreciated that there has been provided a method for forming a semiconductor device, such as a SON device or an gate-all-around device, wherein the semiconductor layer that is removed can be selectively etched compared to surrounding layers. For example, porous silicon has an selectively of approximately 100,000 when compared with silicon (sense or nonporous). Current SON or gate-all-around technologies use silicon germanium, not porous silicon or porous silicon germanium, and silicon germanium has a selectivity with silicon of approximately 70 to 120. Therefore, using porous silicon or porous silicon germanium increases the selectivity by over 1,000.

The transistor terms used herein may refer to one or both of a post-production, functional structure (e.g., a channel of a functional transistor) or a pre-fabrication precursor to such a structure (e.g., a structure which, upon completion of fabrication, will become a channel of a functional transistor). For example, during fabrication, the term "channel structure" refers to a channel precursor. Layer 18 in FIG. 2 is an example of one such channel structure which becomes a channel in FIG. 7 upon being coupled to current electrodes.

In the foregoing specification, the invention has been described with reference to specific embodiments. However, one of ordinary skill in the art appreciates that various modifications and changes can be made without departing from the scope of the present invention as set forth in the claims below, such as those described herein. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device comprising:
   providing a semiconductor substrate;
   forming a first layer over the semiconductor substrate, wherein the first layer comprises a porous material, wherein the porous material comprises silicon;
   forming a second layer over the first layer, wherein the second layer comprises silicon;
   forming a gate insulator over the second layer;
   forming a control electrode over the gate insulator; and
   selectively removing substantially all of the first layer with respect to the second layer and the semiconductor substrate.

2. The method of claim 1, further comprising patterning the first layer and the second layer to form a patterned first layer and a patterned second layer, wherein the patterned first layer has exposed sides.

3. The method of claim 2, wherein selectively removing the first layer further comprises laterally etching the patterned first layer by attacking the exposed sides.

4. The method of claim 2, further comprising:
forming a first current electrode adjacent a first side of the second layer; and
forming a second current electrode adjacent a second side of the second layer, wherein the first side is opposite the second side.

5. The method of claim 1, wherein providing the semiconductor substrate comprises providing the semiconductor substrate comprising silicon.

6. The method of claim 5, wherein providing the semiconductor substrate further comprises providing the semiconductor substrate further comprising a material selected from the group consisting of monocrystalline silicon, silicon germanium, silicon carbide, and silicon carbon alloy.

7. The method of claim 1, wherein removing the first layer further comprises laterally etching the first layer.

8. The method of claim 1, wherein forming the first layer further comprises forming the first layer wherein the first layer has a porosity between approximately twenty (20) and approximately fifty (50) percent.

9. The method of claim 1, wherein forming the second layer over the first layer further comprises epitaxially growing the second layer on the first layer.

10. The method of claim 1, wherein selectively removing comprises a chemistry having an etch selectivly of the first layer to the second layer greater than approximately 1,000.

11. The method of claim 10, wherein selectively removing comprises a chemistry having an etch selectivly of the first layer to the second layer greater than approximately 10,000.

12. The method of claim 1, wherein selectively removing comprises a chemistry having an etch selectivly of the first layer to the second layer of approximately 100,000.

13. The method of claim 1, wherein forming the first layer further comprises forming the first layer from a material selected from die group consisting of silicon, silicon germanium, silicon carbide, and silicon carbon alloy.

14. A method of forming a semiconductor device comprising:
providing a semiconductor substrate;
forming a first layer over the semiconductor substrate;
forming a second layer over the first layer, wherein the second layer comprises silicon wherein the first layer has an etch selectivity to the second layer that is greater than approximately 1,000;
forming a gate insulator over the second layer;
forming a control electrode over the gate insulator; and
selectively removing substantially all of the first layer with respect to the second layer and the semiconductor substrate.

15. The method of claim 14 wherein the first layer has an etch selectively to the second layer greater than approximately 10,000.

16. The method of claim 14, wherein the first layer has an etch selectively to the second layer is approximately 100,000.

17. The method of claim 14, wherein the first layer comprises porous silicon and die second layer comprises silicon.

18. The method of claim 14, further comprising patterning the first layer and the second layer to form a patterned first layer and a patterned second layer, wherein the patterned first layer has exposed sides.

19. The method of claim 18, wherein selectively removing the first layer further comprises laterally etching the first layer by attacking the exposed sides.

* * * * *

UNITED STATES PATENT AND TRADEMARK OFFICE
CERTIFICATE OF CORRECTION

PATENT NO.        : 7,256,077 B2                                    Page 1 of 1
APPLICATION NO.   : 10/851607
DATED             : May 21, 2004
INVENTOR(S)       : Marius K. Orlowski et al.

It is certified that error appears in the above-identified patent and that said Letters Patent is hereby corrected as shown below:

In Column 9, Line 4, Claim No. 4:
　　Change "of claim 2" to --of claim 1--

In Column 10, Line 3, Claim No. 13:
　　Change "die" to --the--

In Column 10, Line 21, Claim No. 16:
　　Change "of claim 14" to --of claim 15--

Signed and Sealed this

Twentieth Day of November, 2007

JON W. DUDAS
*Director of the United States Patent and Trademark Office*

UNITED STATES PATENT AND TRADEMARK OFFICE
CERTIFICATE OF CORRECTION

PATENT NO.       : 7,256,077 B2                                   Page 1 of 1
APPLICATION NO.  : 10/851607
DATED            : August 14, 2007
INVENTOR(S)      : Marius K. Orlowski et al.

It is certified that error appears in the above-identified patent and that said Letters Patent is hereby corrected as shown below:

In Column 9, Line 4, Claim No. 4:
    Change "of claim 2" to --of claim 1--

In Column 10, Line 3, Claim No. 13:
    Change "die" to --the--

In Column 10, Line 21, Claim No. 16:
    Change "of claim 14" to --of claim 15--

This certificate supersedes Certificate of Correction issued November 20, 2007.

Signed and Sealed this

Twenty-fifth Day of December, 2007

JON W. DUDAS
*Director of the United States Patent and Trademark Office*